(12) United States Patent
Umeki et al.

(10) Patent No.: US 7,129,624 B2
(45) Date of Patent: Oct. 31, 2006

(54) CRYSTAL UNIT

(75) Inventors: Mitoshi Umeki, Saitama (JP); Kenichi Kikuchi, Saitama (JP); Keisuke Hirano, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/035,313

(22) Filed: Jan. 13, 2005

(65) Prior Publication Data
US 2005/0151450 A1  Jul. 14, 2005

(30) Foreign Application Priority Data
Jan. 13, 2004  (JP) .............................. 2004-005486

(51) Int. Cl.
*H01L 41/08* (2006.01)
(52) U.S. Cl. ...................... 310/346; 310/324; 310/320; 310/365; 310/367
(58) Field of Classification Search ................ 310/320, 310/346, 365, 367, 324
See application file for complete search history.

(56) References Cited

U.S. PATENT DOCUMENTS

| | | | | |
|---|---|---|---|---|
| 3,382,381 | A | * | 5/1968 | Horton ........................ 310/320 |
| 3,872,411 | A | * | 3/1975 | Watanabe et al. ........... 333/187 |
| 4,306,170 | A | * | 12/1981 | Motte et al. ................. 310/361 |
| 6,544,478 | B1 | * | 4/2003 | Oyama et al. ........... 422/82.01 |
| 6,750,593 | B1 | * | 6/2004 | Iwata .......................... 310/321 |

FOREIGN PATENT DOCUMENTS

JP         4-276914         * 10/1992

* cited by examiner

*Primary Examiner*—Thomas M. Dougherty
(74) *Attorney, Agent, or Firm*—Knobbe Martens Olson & Bear, LLP

(57) ABSTRACT

A crystal unit comprises an AT-cut crystal blank, and an excitation electrode formed on each of opposing main surfaces of the crystal blank in an oscillation region of the crystal blank. The ratio b/a is 0.014 or less, and preferably 0.012 or less where a represents the thickness of the crystal blank in the oscillation region and b represents the thickness of the excitation electrode. The thickness a is typically 5 μm or less.

10 Claims, 4 Drawing Sheets

CRYSTAL UNIT

BACKGROUND OF THE INVENTION

1. Field of the Invention

The present invention relates to a quartz crystal unit for high frequency such as 300 MHz or more, and particularly to a crystal unit that has a reduced change in oscillation frequency when it is mounted on a wiring board by reflow soldering or the like.

2. Description of the Background Art

Crystal units with a quartz crystal blank contained in a casing are integrated into oscillators or filters in various electronic devices as a reference source of frequency or time. Crystal units are now designed to have higher oscillation frequencies as they are also integrated into optical communication systems. For achieving such higher oscillation frequencies, a crystal unit is developed in which an oscillation region of a crystal blank has a recess to reduce the thickness of the crystal blank at the recess thereby increasing the oscillation frequency, and the relatively thicker portion around the recess supports the oscillation region to maintain the mechanical strength.

FIG. 1 is an exploded perspective view of such a conventional crystal unit. The crystal unit comprises casing body 1 composed of ceramics or the like and having a recess, and crystal blank 2 contained in casing body 1. Casing body 1 substantially has a rectangular parallelepiped shape, and crystal blank 2 substantially has a rectangular shape. A step is provided in one side of the recess of casing body 1. A pair of connection terminals 3 for electrical connection to the crystal blank are provided at both ends of top of the step. A pair of mounting terminals (not shown) used for surface mounting of the crystal unit on a wiring board are provided on the outer surface of casing body 1. The mounting terminals are connected to connection terminals 3 through via holes provided in casing body 1.

The configuration of crystal blank 2 is shown in FIGS. 2A and 2B in detail. Crystal blank 2 typically comprises an AT-cut quartz crystal blank. The AT-cut crystal blank has a resonance frequency that depends on its thickness, and a smaller thickness thereof produces a higher oscillation frequency. Accordingly, in order to achieve a higher oscillation frequency, hole 4 is provided in a center portion of one main surface of crystal blank 2 so that the crystal blank has at the bottom of hole 4 a smaller thickness than the thickness at the peripheral portion, thereby defining the portion of reduced thickness as an oscillation region. Excitation electrodes 5 are provided on opposing main surfaces of crystal blank 2 in the oscillation region. Extending electrodes 6 extend from the respective excitation electrodes 5 towards respective opposing sides of one shorter edge of crystal blank 2. The pair of extending electrodes 6 are to be associated with the pair of connection terminals 3 provided on the step of casing body 1. A tip end of extending electrode 6 provided on the shown, upper surface of crystal blank 2 turns at the afore-mentioned shorter edge onto the shown, lower surface of crystal blank 2.

Excitation electrode 5 and extending electrode 6 have a two-layer structure consisting of an under-layer electrode (i.e., adhesion film) deposited directly on crystal blank 2, and a conduction electrode layer formed on the under layer electrode. The first, under layer electrode is formed of a material such as chromium, a nickel-chromium alloy, or a nickel-tungsten alloy, and the second, conduction electrode layer is formed of, for example, gold. The under-layer electrode and conduction electrode layer are deposited by a method such as vacuum evaporation, or sputtering.

The opposing sides of one shorter edge of crystal blank 2, which have been described above, are fixed to the pair of connection terminals 3 by adhesive members 7 such as conductive adhesive, so that crystal blank 2 is retained horizontally in the recess of casing body 1, and connection terminals 3 and extending electrodes 6 are electrically connected, thereby electrically connecting the mounting terminals provided on the outer surface of casing body 1 and excitation electrodes 5 of crystal blank 2.

After fixing crystal blank 2 to the step of the recess as described above, the open side of recess is sealed by cover 10 so that crystal blank 2 is hermetically sealed in the casing. When integrating the crystal unit thus formed into an actual circuit, the crystal unit is mounted on a wiring board, and fixed to the wiring board by, for example, reflow soldering.

However the above-described crystal unit has a problem that change in oscillation frequency occurs through mounting process, when it is transferred in a furnace for reflow soldering in the mounting process onto a wiring board. In particular, this change in oscillation frequency is more prominent for crystal units having higher nominal oscillation frequencies.

SUMMARY OF THE INVENTION

Accordingly, it is an object of the present invention to provide a crystal unit having a reduced change in oscillation frequency that occurs due to heating in mounting onto a wiring board.

To achieve the present invention, the inventors of the present invention have studied the cause of the change in oscillation frequency that occurs through heating. The finding of the inventors' study will be explained for the description of the present invention.

When a crystal unit passes through a furnace for reflow soldering, crystal blank 2 is subject to heating of about 240 to 260° C. This causes thermal expansion of crystal blank 2 and excitation electrodes 5. Since there is a difference between the thermal expansion coefficients of crystal blank 2 and excitation electrodes 5, distortion occurs in crystal blank 2. Since they are subject to room temperature again after the heating, the distortion of crystal blank 2 usually disappears and the oscillation frequency of crystal blank 2 returns to the value before the heating. However, the inventor found that in the case where the thickness of excitation electrode 5 is not negligible with respect to the thickness of crystal blank 2 at the oscillation region, the distortion due to the thermal expansion difference, even after returning to room temperature from the heated state, does not disappear under the influence of excitation electrode 5, and the oscillation frequency then returns to the original oscillation frequency before the heating, gradually through, for example, several ten days.

For example, in the case of the oscillation frequency of crystal blank 2 being 100 MHz, the thickness a of AT-cut quartz crystal blank should be about 17 μm. The thickness b of excitation electrode 5 is typically about 80 nm. Thus the thickness ratio b/a of excitation electrode 5 to crystal blank 2 is about 0.0047. In the case of ratio b/a being about such a small value, when thermal expansion occurs and the temperature then returns to room temperature, the distortion disappears immediately after returning to room temperature since the thickness of crystal blank 2 is substantially large relative to that of excitation electrode 5 and hence there is substantially no influence from excitation electrode 5. There is substantially no change in oscillation frequency through the heating.

It was found that the occurrence of the frequency change between before and after the heating is remarkably reduced for lower thickness ratios b/a of excitation electrode 5 to crystal blank 2.

On the other hand, in the case of a higher oscillation frequency, for example, 622 MHz, the thickness a of crystal blank 2 should be about 2.7 µm. If the thickness b of excitation electrode 5 is 80 nm, the thickness ratio b/a of excitation electrode 5 to crystal blank 2 is about 0.03. When the ratio b/a is at about such a value, there is influence from excitation electrode 5, and accordingly the distortion in crystal blank 2 due to thermal expansion difference does not disappear even after the heating. According to the inventors' finding, a change in oscillation frequency of 2 ppm (parts-per-million) or more occurs through the heating, and the oscillation frequency returns to the original oscillation frequency after, for example, 1000 hours (about 42 days).

In summary, the inventors have found that in the case of small thickness of crystal blank 2, hysteresis of oscillation frequency occurs due to thermal stress.

In the case of excitation electrode 5 having a non-negligible thickness with respect to crystal blank 2, the mass of excitation electrode 5 acts as a mechanical load and interfere with the oscillation of crystal blank 2. As a result, the frequency-to-temperature characteristics of the crystal blank degrade. FIG. 3 is a graph illustrating change in oscillation frequency of a crystal blank due to temperature. An AT-cut crystal blank, as shown by curve A in the figure, has a frequency-to-temperature characteristic of cubic curve that has an inflection point at room temperature (about 25° C.), a maximum value at a lower temperature, and minimum value at a higher temperature. On the other hand, when the influence from the mass of excitation electrode 5 occurs, the frequency difference between the frequency maximum and minimum points before and after the inflection point increases as shown by curve B in the figure, and a frequency change for a temperature change increases, resulting in the degradation of the frequency-to-temperature characteristic.

Accordingly, the object of the present invention is achieved by a crystal unit comprising: an AT-cut crystal blank; and an excitation electrode formed on each of opposing main surfaces of the crystal blank in an oscillation region of the crystal blank, wherein ratio b/a is 0.014 or less where a represents the thickness of the crystal blank in the oscillation region and b represents the thickness of the excitation electrode.

With the crystal unit having the above features, the contribution of the thickness of the excitation electrode to the thickness of the crystal blank is reduced, and the distortion due to thermal expansion difference, which occurs in heating when the crystal unit is mounted on a wiring board, easily disappear, as will be understood from the examples described later. Accordingly, it is possible to prevent the oscillation frequency of the crystal unit from changing through the heating, thereby suitably retains the frequency-to-temperature characteristic.

The present invention is advantageous, in particular when the crystal unit uses a crystal blank having a thickness a of 5 µm or less in the oscillation region, or the crystal unit has an oscillation frequency higher than 300 MHz. The ratio b/a is more preferably 0.012 or less.

In the present Invention, the crystal blank may have a peripheral portion surrounding the oscillation region and having a thickness larger than the thickness of the oscillation region. This feature enhance the mechanical strength of the crystal unit, thereby allowing the reduction of the thickness a of the oscillation region to increase the oscillation frequency.

In the present invention, the reduced thickness b of the excitation electrode can increase the crystal impedance (CI) of the crystal unit. Thus, by providing an extending electrode that individually extends to the peripheral portion of the crystal blank from each excitation electrode with the extending electrode having a thickness larger than that of the excitation electrode, the increase in crystal impedance can be reduced.

Especially, the present invention is advantageous in the case that gold is used as the excitation electrode, especially as the conduction electrode layer. Since gold has a large electric conductivity gold can reduce the CI of the crystal unit. Gold is chemically stable. Therefore, gold is widely used for the excitation electrodes. However, according to the inventors' finding, the above-mentioned hysteresis phenomenon is prominent when gold is used for the excitation electrode. By setting the ratio b/a to 0.014 or less as defined in the present invention, the change in the oscillation frequency through the heating is remarkably prevented and the frequency-to-temperature characteristic is suitably maintained even if gold is used for the excitation electrode.

DETAILED DESCRIPTION OF THE PREFERRED EMBODIMENT

Figure 1:
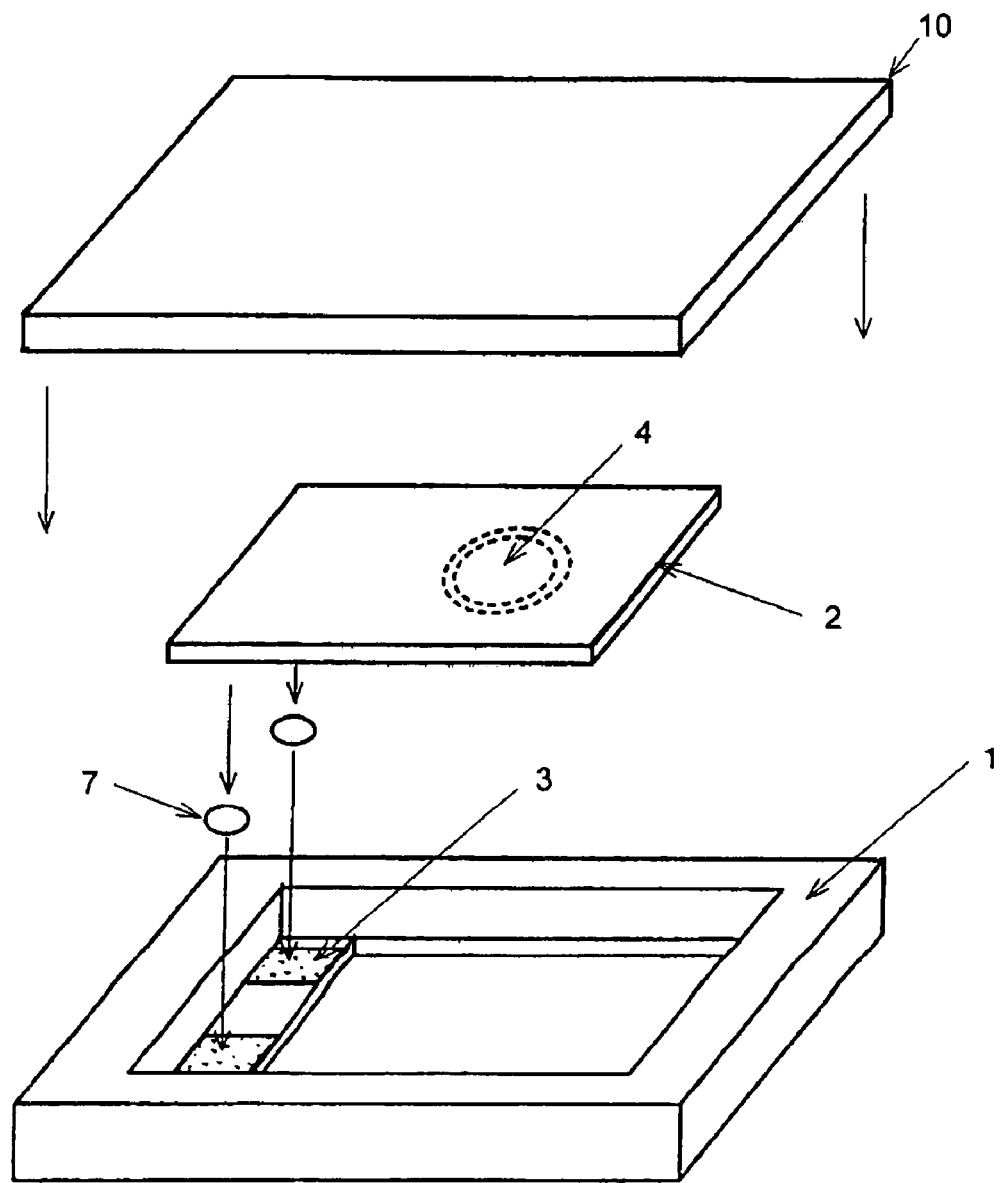
FIG. 1 is an exploded view of an exemplary conventional crystal unit.
Figure 2A:
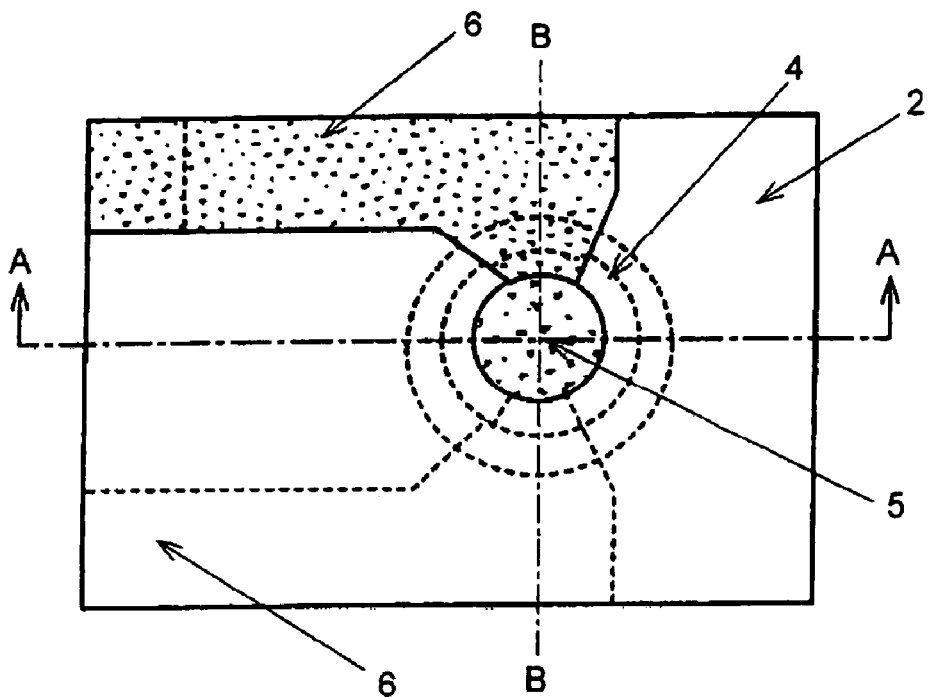
FIG. 2A is a plan view of a crystal blank in a conventional crystal unit.
Figure 2B:
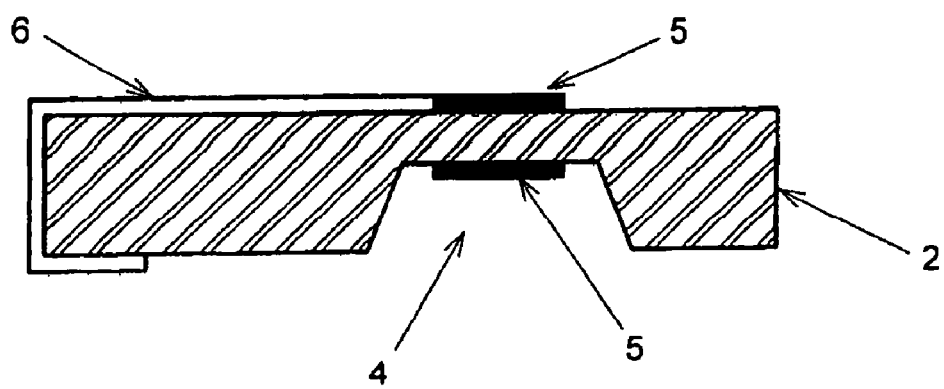
FIG. 2B is a section view along A—A in FIG. 2A.
Figure 4:
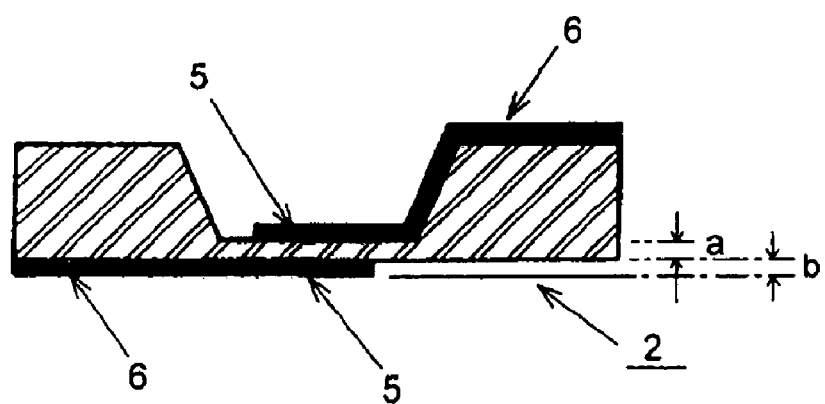
FIG. 4 is a schematic section view of an example of a crystal blank according to the present invention.

A quartz crystal unit of a preferred embodiment of the present invention is a crystal unit using AT-cut crystal blank 2, as shown in FIG. 4, in which a represents the thickness of the oscillation region in crystal blank 2 and b represents the thickness of excitation electrode 5; thickness a is 5 µm or less, and the ratio b/a is 0.014 or less. FIG. 4 is a view corresponding to the cross section at line B—B of FIG. 2A.

Results of experiments conducted by the inventors will be described.

Different crystal units having different ratio b/a of crystal blanks were produced, and changes in oscillation frequency between those before and after heating were investigated for the case where the crystal units were subject to reflow heating. The crystal blanks had an oscillation frequency of 622 MHz and hence a thickness a in the oscillation region of about 2.7 µm, while excitation electrodes had different thicknesses b. The diameter of oscillation regions was 0.5 mm, and the diameter of the excitation electrode was 0.17 mm. The excitation electrode had a first layer or under-layer electrode consisting of NiW (nickel-tungsten), and a second layer or conduction electrode layer consisting of Au (gold). The thickness of the under-layer electrode was 7.5 nm or less so that it was negligible. Thus, the thickness of the second, Au layer was regarded as the thickness b of the excitation electrode.

Reflow heating was performed by transferring a crystal unit in a reflow furnace of 260° C. for 30 seconds. Measurement was made for the oscillation frequency before the reflow heating, and for the oscillation frequency after finishing the reflow heating and then exposing to room temperature for two hours, so that a frequency deviation $\Delta f$ was obtained.

Table 1 shows the measurement results of the ratio b/a and frequency deviation $\Delta f$.

TABLE 1

| | b/a | | | | |
|---|---|---|---|---|---|
| | 0.009 | 0.011 | 0.017 | 0.021 | 0.031 |
| $\Delta f$ [ppm] | 1 | 2 | 4.5 | 5.5 | 10 |

Figure 5:
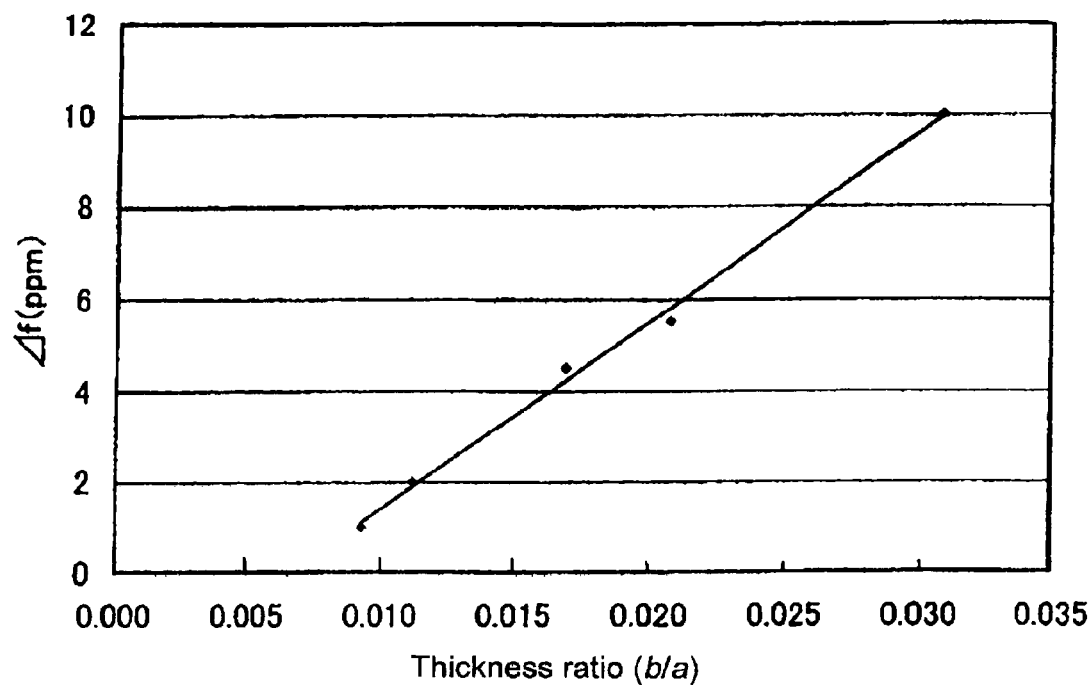
FIG. 5 is a graph of frequency deviation characteristic of a crystal blank with respect to the ratio b/a where a represents the thickness of the crystal blank in an oscillation region and b represents the thickness of an excitation electrode.

FIG. 5 is a graph indicating the results. These results shows that in order to reduce the frequency deviation $\Delta f$ between the frequencies before and after the heating to 3 ppm or less, or to 2 ppm or less, the ratio b/a should be 0.014 or less, or 0.012 or less, respectively. In the case of an oscillation frequency of 622 MHz, the thickness a of the crystal blank is about 2.7 µm, and thus the thickness b of the excitation electrode should be about 38 nm or less, or 32 nm or less, respectively.

Note that the reason of limiting the frequency deviation $\Delta f$ to 3 ppm or less, or 2 ppm or less comes from standards regarding aging characteristics. Specifically, a standard about aging characteristics specifies that the variation in frequency due to aging through a period of 20 years at a temperature of 85° C. is ±5 ppm. Then, if the frequency change due to factors other than those regarding to reflow heating is 2 ppm, the tolerance is 3 ppm. To ensure the compliance with the aging standard, the tolerance of frequency deviation $\Delta f$ between the frequencies before and after reflow heating should be 2 ppm or less.

Figure 3:
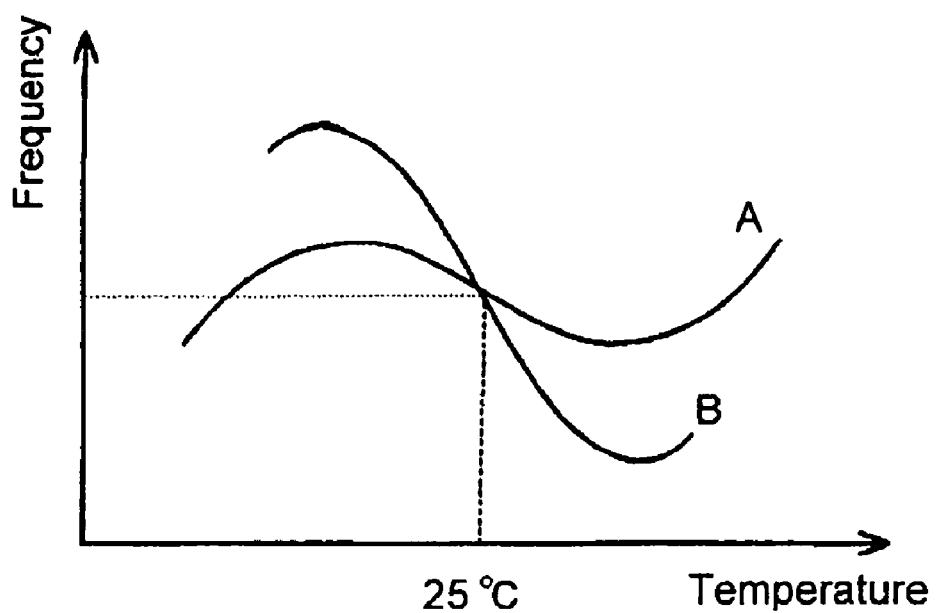
FIG. 3 is a graph illustrating a frequency-to-temperature characteristic of a crystal blank.

Thus, when the ratio b/a of the thickness b of the excitation electrode to the thickness a of the crystal blank in the oscillation region is 0.014 or 0.012, the influence of hysteresis due to thermal stress can be reduced. Moreover, the reduction of the thickness ratio of the excitation electrode to crystal blank can reduce the mechanical load on the crystal blank, thereby well maintains oscillation characteristics, particularly frequency-to-temperature characteristics, of the crystal blank. In other words, as shown by curve A in the graph of FIG. 3, inherent frequency-to-temperature characteristics of the crystal blank can be obtained in which the frequency deviation for temperature is small.

Figure 6:
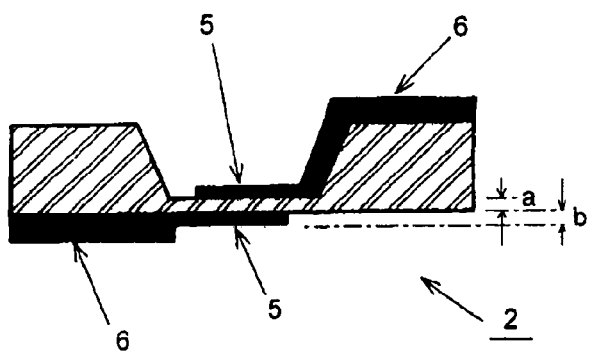
FIG. 6 is a schematic section view of another example of a crystal blank according to the present invention.

In the case where the reduction of the thickness of the excitation electrode increases the electrical resistance of the electrode and hence the crystal impedance, the crystal impedance can be improved, for example, when extending electrode 6 has a large thickness while excitation electrode 5 still has a small thickness a, as shown in FIG. 6. FIG. 6 is a view corresponding to the cross section at line B—B of FIG. 2A.

Preferred embodiments of the present invention have been described for a crystal blank having an oscillation frequency of 622 MHz. However, the present invention can be suitably used for a crystal unit having an oscillation frequency of about 300 MHz or more. The reason of this is that in the case of oscillation frequency of 300 MHz or less, the thickness a of the crystal blank in the oscillation region is substantially large relative to the thickness b of the excitation electrode, and b/a is then generally 0.02 or less so that the change in frequency due to reflow heating can be neglected.

In the above description, a crystal blank is used which has an oscillation region that is thinner than the peripheral portion. However, the present invention can also be suitably used for a crystal unit having a flat crystal blank. The description has been also made for a crystal blank having a frequency-to-temperature characteristic of cubic curve that has an inflection point at room temperature, a maximum value at a lower temperature, and a minimum value at a higher temperature. However, the frequency-to-temperature characteristic of the crystal blank may monotonically increases in the operation temperature range including room temperature.

What is claimed is:

1. A crystal unit comprising:
   an AT-cut crystal blank; and
   an excitation electrode formed on each of opposing main surfaces of the crystal blank in an oscillation region of the crystal blank,
   wherein ratio b/a is 0.014 or less where a represents a thickness of the crystal blank in the oscillation region and b represents a thickness of the excitation electrode.

2. The crystal unit according to claim 1, wherein the thickness a is 5 µm or less.

3. The crystal unit according to claim 1, wherein the crystal blank has a peripheral portion surrounding the oscillation region and having a thickness larger than the thickness of the oscillation region.

4. The crystal unit according to claim 1, further comprising an extending electrode that individually extends to a peripheral portion of the crystal blank from each of the excitation electrodes, wherein the extending electrode has a thickness larger than the thickness of the excitation electrode.

5. The crystal unit according to claim 1, wherein the ratio b/a is 0.012 or less.

6. The crystal unit according to claim 2, wherein the ratio b/a is 0.012 or less.

7. The crystal unit according to claim 1, wherein the excitation electrode comprises a gold layer.

8. The crystal unit according to claim 2, wherein the excitation electrode comprises a gold layer.

9. The crystal unit according to claim 1, which has an oscillation frequency higher than 300 MHz.

10. The crystal unit according to claim 1, which has a change in oscillation frequency of 3 parts-per-million (ppm) or less as measured when the crystal unit is mounted on a wiring board by reflow soldering.

* * * * *